United States Patent
Knott et al.

[11] Patent Number: 5,886,413
[45] Date of Patent: Mar. 23, 1999

[54] REUSABLE, SELECTIVELY CONDUCTIVE, Z-AXIS ELASTOMERIC COMPOSITE SUBSTRATE

[75] Inventors: Bradley D. Knott, Phoenix, Ariz.; Carmine G. Meola, Elkton, Md.; David L. Murray, Chandler; Mark Stephen Spencer, Maricopa, both of Ariz.

[73] Assignee: Gore Enterprise Holdings, Inc., Newark, Del.

[21] Appl. No.: 948,807

[22] Filed: Oct. 9, 1997

Related U.S. Application Data

[62] Division of Ser. No. 724,393, Oct. 1, 1996, Pat. No. 5,731,073.

[51] Int. Cl.$^6$ ............................ H01L 23/48; H01L 29/40
[52] U.S. Cl. .................. 257/778; 257/738; 257/780; 257/783
[58] Field of Search ................... 257/738, 778, 257/780, 783; 428/308.4, 317.1, 317.7, 317.9, 319.1, 319.3, 422

[56] References Cited

U.S. PATENT DOCUMENTS

| | | | |
|---|---|---|---|
| 3,925,578 | 12/1975 | Polichette et al. | 427/304 |
| 3,953,566 | 4/1976 | Gore | 264/288 |
| 3,969,554 | 7/1976 | Ziblisky | 427/305 |
| 3,993,802 | 11/1976 | Polichette et al. | 427/98 |
| 4,199,623 | 4/1980 | Nuzzi et al. | 427/305 |
| 4,259,113 | 3/1981 | Nuzzi et al. | 106/1.11 |
| 4,450,190 | 5/1984 | Nuzzi et al. | 427/304 |
| 4,511,597 | 4/1985 | Teng et al. | 427/53.1 |
| 4,557,957 | 12/1985 | Manniso | 428/36 |
| 4,594,311 | 6/1986 | Frisch et al. | 430/315 |
| 4,662,944 | 5/1987 | Nuzzi et al. | 106/1.11 |
| 4,680,317 | 7/1987 | Kuhnel et al. | 521/89 |
| 4,701,362 | 10/1987 | Suzuki et al. | 428/131 |
| 4,747,897 | 5/1988 | Johnson | 156/148 |
| 4,748,056 | 5/1988 | Nuzzi et al. | 427/304 |
| 4,784,901 | 11/1988 | Hatakeyama et al. | 428/268 |
| 4,916,017 | 4/1990 | Nomi et al. | 428/413 |
| 5,026,591 | 6/1991 | Henn et al. | 428/198 |
| 5,188,890 | 2/1993 | Ohashi et al. | 428/306.6 |
| 5,190,813 | 3/1993 | Ohashi et al. | 428/319.3 |
| 5,227,230 | 7/1993 | McGlade | 428/319.1 |
| 5,238,735 | 8/1993 | Nagou et al. | 428/304.4 |
| 5,468,531 | 11/1995 | Kikukawa et al. | 428/36.5 |
| 5,498,467 | 3/1996 | Meola | 428/198 |
| 5,512,360 | 4/1996 | King | 428/304.4 |
| 5,637,920 | 6/1997 | Loo | 257/700 |
| 5,731,073 | 3/1998 | Knott et al. | 428/304.4 |

FOREIGN PATENT DOCUMENTS

| | | |
|---|---|---|
| 0 213 774 | 3/1987 | European Pat. Off. |
| WO 84/03645 | 9/1984 | WIPO . |
| WO 93/05960 | 4/1993 | WIPO . |

*Primary Examiner*—Blaine R. Copenheaver
*Attorney, Agent, or Firm*—Victor M. Genco, Jr.

[57] ABSTRACT

The invention relates to an open cell, porous, selectively conductive member containing an elastomer that is reusable in use and preparation. The scaffold for the elastomer has conductive areas through conductive, z-axis pathways are provided which are electrically isolated from adjacent z-axis conductive pathways. The elastomer is non-adhesive and/or non tacky and allows for temporary connection of electronic components.

39 Claims, 12 Drawing Sheets

REUSABLE, SELECTIVELY CONDUCTIVE, Z-AXIS ELASTOMERIC COMPOSITE SUBSTRATE

CROSS-REFERENCE TO RELATED APPLICATION

This application is a divisional of application Ser. No. 08/724,393, filed Oct. 1, 1996, now issued as U.S. Pat. No. 5,731,073.

FIELD OF THE INVENTION

The present invention relates to selectively conductive, composite substrates, their use and method of manufacture. More specifically, the present invention relates to planar, open cell, porous substrates having a series of z-axis conductivity pathways extending from one side of the substrate to the other side, which pathways are electrically isolated from one another, and where the porous substrate can also contain an elastomer to form a reusable, readily separable, selectively conductive composite substrate.

BACKGROUND OF THE INVENTION

It is a goal in the electronics industry to be able to provide reliable electrical connections between electronic circuit components for evaluation and testing. Further, the substrate used to connect components must be able to compensate for dimensional irregularities in the components or subcomponent assemblies being connected. It is presently common practice to use permanent adhesives or solder to connect chips to circuit boards, circuit boards to circuit boards, multichip modules to circuit boards or terminals to terminal connectors for the purpose of evaluating the performance of these components. A chip to circuit board connection can be accomplished with either permanent adhesives or solder. After the test or evaluation procedure is completed, such as in testing for continuity, it is desirable to remove the chip without damaging either the chip, board or electrical contacts thereof. Removing the permanent adhesive from either components, and/or metal contact components is not always satisfactory, as in the case of a soldered BGA chip which becomes unacceptable for use after solder reflow. Similarly, for terminal connections, since solder reflow is necessary for separation, not only is the article frequently damaged, but additional processing steps are required. The additional processing step could also damage the connector or chip.

It is also often necessary to provide temporary connections between traces of one flexible circuit to the traces of another flexible circuit or a ribbonized flat cable to a printed circuit board, or the like. Removal of permanent adhesives and solder joints can frequently result in the loss of the components which are being separated from one another. Similarly, in the medical industry, connector interfaces that provide power sources to surgical implements are conventionally formed via solder connection or permanent adhesives. Separation of the medical device from the power source for cleaning and sterilization result in the damage of instruments, which must be removed for further use.

Thus, a need exists for a temporary and reusable selectively conductive substrate for testing electronic components, e.g., chips, electrical contacts, circuit boards, or for connecting medical instruments to power sources, and the like, that will overcome the drawbacks of the existing prior art connecting techniques.

SUMMARY OF THE INVENTION

This invention relates to a temporary, reusable selectively conductive, z-axis member that contains an elastomer that is non-tacky, non-adhesive, has a conductivity less than 100 mili ohms, and requires low assembly pressures on the order of less than 50 psi to reliably, electrically connect electronic components. The substrate for containing the elastomer is formed from a planar, open cell, porous material that contains a plurality of selected areas which each respectively define irregular, z-axis conductive pathways. These pathways extend from one side of the material to the other side and are electrically isolated from one another in the X and Y axes directions. The conductive pathways are formed from any suitable conductive metal.

The z-axis material, with elastomer, is capable of being compressed from 25% to 75% of its uncompressed dimension. The pore size of the material for forming the z-axis conductive pathways is selected so that the irregularly shaped z-axis metal conductive pathways are electrically isolated from each other in the X and Y axes directions.

In U.S. Pat. No. 5,498,467, a planar, open cell, porous member made of a material having pores through it in the z-axis direction is selectively treated to form a series of conductive paths through the thickness of the z-axis direction from one side of the member to the other. The paths are irregular in shape and are made receptive to deposition of a metal salt, which metal salt on exposure to radiant energy is converted to nonconductive metal nuclei which then act to catalyze deposition of a conductive metal from an electroless metal deposition solution.

The open cell material is made receptive to metal deposition by treating it in selected areas with a liquid radiation sensitive composition comprising a solution of a light sensitive reducing agent, a metal salt, a source of halide ions, and a second reducing agent. The material is in contact with the radiation sensitive composition for a time sufficient, usually 5 to 15 seconds, for the composition to permeate or penetrate through the pores of the material and form a coating on the material along the material defining the pores from one side of the porous planar material to the other.

The member is then dried and the surface of one side is masked in selected areas with an opaque cover so that subsequent radiation will not strike the covered area. Thereafter, the treated member is exposed to radiation, usually ultraviolet radiation, for a time and at a power sufficient to reduce the metallic cations in the metal salt to metal nuclei throughout the thickness of the member. The member is then unmasked and washed with an acidic or alkaline washing solution to wash off the radiation sensitive composition that had been protected by the opaque cover. The acidic or alkaline washing (or fixing) solution does not affect the areas where the radiation had reduced the metal cations to metal nuclei, if the solution is not left in contact with the areas for more than a few minutes, e.g., 5 minutes or less.

The member is next subjected to a reactive metallic cation replacement solution to replace the metal nuclei and provide a suitable stabilized area to receive a conductive metal. The metal nuclei from the reducing composition is not stable enough to directly deposit conductive metal on because of the tendency of the metal to be oxidized. The metallic cation provides greater stability, and is preferably a noble metal, such as, palladium or gold.

Once the metallic cations are deposited, the member is then plated electrolessly by subjecting it to a solution of a conductive metal salt, dried and resulting in a scaffold member, containing pores, that is selectively conductive throughout the z-axis direction in those selected areas that had not been covered by the masking. Thereafter, a solution containing a material that exhibits elastomeric properties, is imbibed or impregnated into the remaining pores of the z-axis scaffold. The impregnated member, which may be completely saturated with the elastomic solution, is air dried and then oven dried to remove the elastomer solvent. This results in a reusable z-axis connector that is non-tacky and/or non-adhesive, and effectively forms an electrical contact substrate that is temporary in design since it is not permanently affixed and is readily separated from components.

Thereafter a chip, medical device, circuit board or the like is connected to another electronic component by positioning the elastomer containing z-axis material therebetween. For example, the components can be assembled by providing a planar, open cell, porous material having a x, y and z-axis with a series of electrically isolated, vertically defined cross-section areas that extend from one side of said material to another side of said material and being covered with conductive metal which is filled with an elastomer, locating the elastomer material between the components to be connected and via compression, providing electrical connection between the two electrical components through the conductive pathways of the z-axis material.

The present invention will now be described with reference to the following detailed description, non-limiting examples, drawings and appended claims.

DETAILED DESCRIPTION OF THE INVENTION

Figure 1:
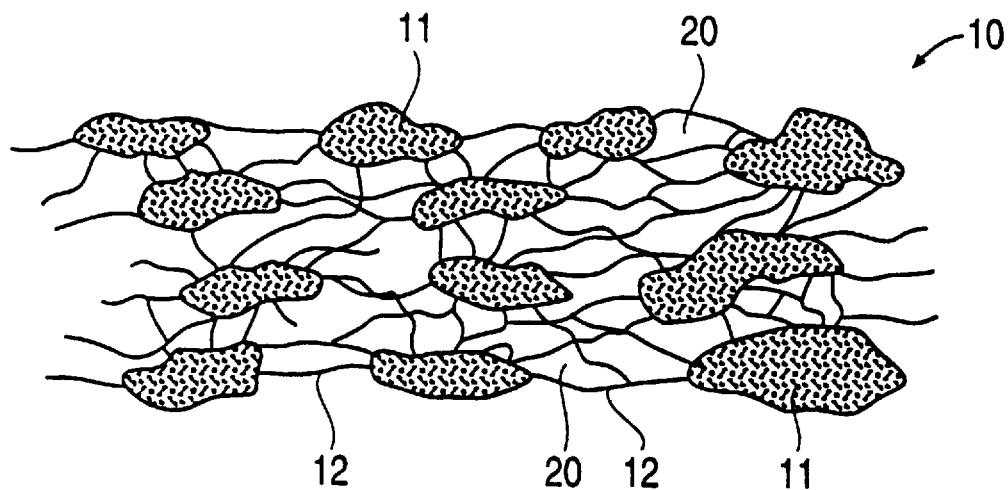
FIG. 1 is a cross sectional schematic view of a planar, open cell, porous member containing membrane having a node-fibril scaffold, prior to conversion to a z-axis conductive, elastomer filled composite.

The elastomer containing members of the present invention are made from a planar, open cell, porous member which has pores through it in the z-axis direction that has been selectively treated in a manner such that a series of conductive paths extend through the thickness of the z-axis direction from one side of the member to the other. These conductive paths are located at certain preselected areas through a vertical cross section of the material. The non-tacky and/or non-adhesive elastomer is contained within pores of the member. As the terms are used herein "non-tacky" and "non-adhesive" shall mean a property of a material which has been reacted sufficiently so that said material, by itself, is highly resistant to bonding with a surface.

A selectively conductive z-axis material that is used to prepare the temporary, reusable composite of the present invention, is described in U.S. Pat. No. 5,498,467, incorporated herein by reference. In general, the planar, open cell, porous member used in the present invention can be any material having continuous pores from one side to the other. The porous planar member must have an internal morphology in which the material defining the pores forms an irregular path through the z-axis direction within a vertically defined cross section through the z-axis plane, as shown in FIGS. 1–4.

Suitable materials for the z-axis member have a thickness on the order of $5\times10^{-6}$ m and $5\times10^{-4}$ m (5 and 500 $\mu$m), and include woven or non-woven fabric, such as a nylon, glass fiber or polyester fabric or cotton, or the like. The member can also be a porous polymeric film or membrane, that is flexible, such as porous polyolefins, e.g., porous polyethylene, porous polypropylene, porous fluoropolymers, or open cell, porous polyurethanes. Additionally, open cell, porous inorganic materials, such as thin porous ceramic plates that have continuous pores from one side to the other can be used.

Porous fluoropolymers include, but are not limited to, porous polytetrafluoroethylene (PTFE), porous expanded polytetrafluoroethylene (ePTFE), porous copolymers of polytetrafluoroethylene and polyesters or polystyrenes, copolymers of tetrafluoroethylene and fluorinated ethylene-propylene (FEP) or perfluoroalkoxy -tetrafluoroethylene (PFA) with a $C_1$–$C_4$ alkoxy group. Preferred porous materials include expanded polypropylene, porous polyethylene and porous polytetrafluoroethylene. Most preferably, the material is expanded polytetrafluoroethylene having a microstructure of nodes inter-connected with fibrils, a void volume of about 20 to 90%, such as the material prepared in accordance with the teachings of U.S. Pat. No. 3,953,566, incorporated herein by reference, exemplified by the ePTFE of FIG. 11.

In a preferred embodiment, the planar porous material generally will have a thickness of between about 5 and 500 $\mu$m, preferably between about 5 and 125 $\mu$m, but thickness is not a critical factor so long as the ultra-violet strength will penetrate the sample.

Figure 4:
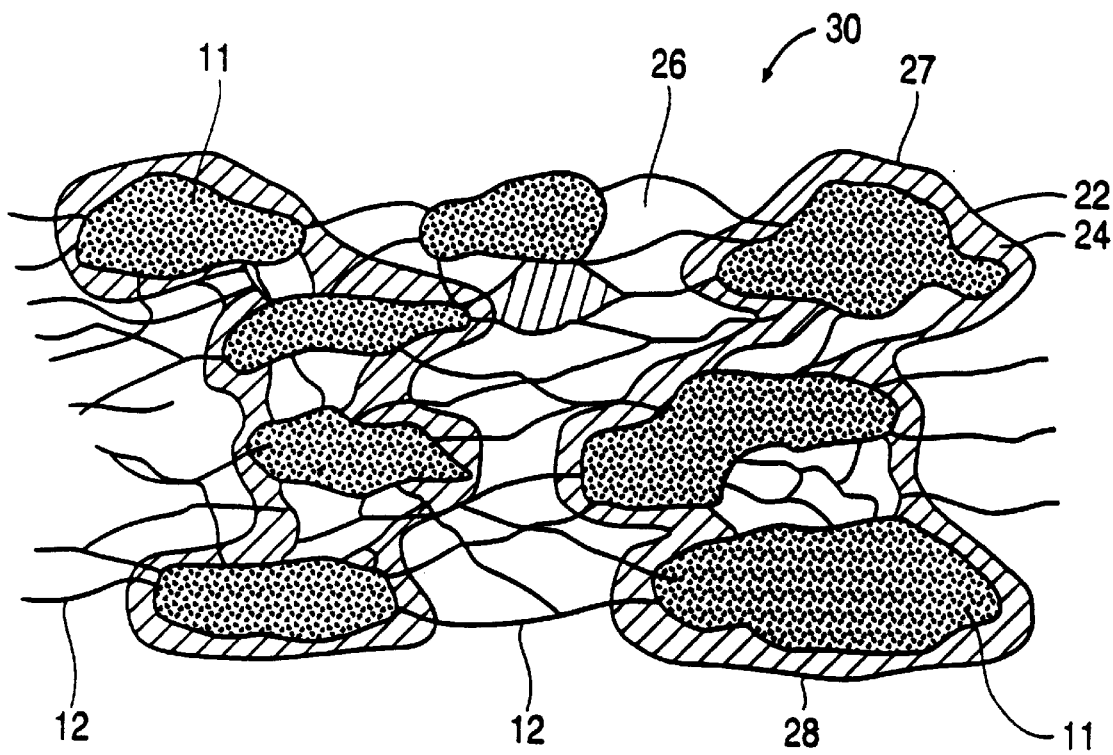
FIG. 4 is a view of a planar, selectively conductive z-axis material containing an imbibed non-adhesive and/or non-tacky elastomer according to the present invention.

When the material 10 for forming the z-axis member is microporous PTFE (expanded polytetrafluoroethylene), the pores 20 are defined as the space between nodes 11 inter-connected with fibrils 12, as shown in FIG. 1. As seen in FIG. 4, the internal structure of nodes inter-connected with fibrils is of a material density that results in an irregular continuous path 22 through the material 10 within a vertically defined cross section of the z-axis from one side of the planar member to the other.

The selectively conductive member 30 (FIG. 5) is prepared by making areas 32 (FIG. 3) through the z-axis direction receptive to deposition of a metal salt, which metal salt on exposure to radiant energy is converted to nonconductive metal nuclei which then act to catalyze deposition of a conductive metal from an electroless metal deposition solution. The pores 20 of material 10, defined above, are first wetted with a wetting agent, such as an alcohol, or organic aqueous surfactant. Methanol, propanol, tetrafluoroethylene/vinyl alcohol copolymers or the like also may be used. The wetting agent acts to make the material receptive to conductive metals such as nickel or copper. Particularly preferred is copper.

A radiation sensitive metal salt composition is a liquid radiation sensitive composition comprising a solution of a light sensitive reducing agent, a metal salt, a source of halide ions, and a second reducing agent. Preferably, the radiation sensitive solution contains water, the metal salt, a light sensitive reducing agent, a second reducing agent, and optionally (for hard to wet surfaces) a surfactant. The metal salt includes but is not limited to, copper acetate, copper formate, copper bromide, copper sulfate, copper chloride, nickel chloride, nickel sulfate, nickel bromide, ferrous bearing compounds, such as, ferrous sulfate, ferrous chloride, and nobel metals such as palladium, platinum, silver, gold and rhodium.

Suitable light-sensitive reducing agents are aromatic diazo compounds, iron salts, e.g., ferrous or ferric oxalate, ferric ammonium sulfate, dichromates e.g., ammonium dichromate, anthraquinone disulfonic acids or salts thereof, glycine (especially active under humid surface conditions), L-ascorbic acid, azide compounds, and the like, as well as metal accelerators, e.g., tin compounds, e.g., stannous chloride or compounds of silver, palladium, gold, mercury, cobalt, nickel, zinc, iron, etc., the latter group optionally being added in amounts of 1 mg to 2 grams per liter.

The second reducing agents, include, but are not limited to, polyhydroxy alcohols, such as glycerol, ethylene glycol, pentaerythritol, mesoerythritol, 1,3-propanediol, sorbitol, mannitol, propylene glycol, 1,2-butanediol, pinacol, sucrose, dextrin, and compounds such as triethanolamine, propylene oxide, polyethylene glycols, lactose, starch, ethylene oxide and gelatin. Compounds which are also useful as secondary reducing agents are aldehydes, such as formaldehyde, benzaldehyde, acetaldehyde, n-butyraldehyde, polyamides, such as nylon, albumin and gelatin; leuco bases of triphenyl methane dyes, such as 4-dimethylaminotriphenylmethane, 4',4',4"-tri-dimethylaminotriphenylmethane; leuco bases of xanthene dyes, such as 3,6-bis dimethylamino xanthene and 3,6-bis dimethylamino-9-(2-carboxyethyl) xanthene; polyethers, such as ethylene glycol diethyl ether, diethylene glycol, diethyl ether tetraethylene glycol dimethyl ether, and the like.

A second reducing agent that is also a humectant, exemplified by sorbitol, is generally preferred as a constituent of the treating solution, for the humectant, apparently by reason of a moisture conditioning effect on the "dry" coating prior to developing. It provides substantial aid in maintaining density of the metal coating on the internal material of the member during a developing step in which any unconverted radiation-sensitive composition in the coating is washed off of the base.

Among the suitable surfactants are polyethenoxy nonionic ethers, such as Triton X-100, manufactured by Rohm & Haas Co., and nonionic surfactants based on the reaction between nonyl phenol and glycidol, such as Surfactants 6G and 10G manufactured by Olin Mathieson Company.

This treating solution, i.e., the radiation sensitive composition, contains an acidifying agent in the form of an acid salt for adjusting the pH of the aqueous solution to usually between about 2.0 and 4.0 (preferably 2.5 to 3.8) and a small quantity of halide ions (iodide, bromide or chloride ions), so that a combination of additives provides a surprising effect in substantially intensifying the density of the coating that is formed subsequently by exposure of the treated planar material to radiant energy. Adjusting the acidity does not always require introducing an agent for that purpose alone, because the adjustment may be accomplished wholly or partially by means of an acidic substance that has other functions also, as exemplified by a light-sensitive reducing agent of an acidic nature (e.g., ascorbic acid, glycerin, etc.) or by some additives for introducing halide ions (e.g., hydrochloric acid). Similarly, some or all of the halide ions may be introduced as components of the reducible metal salt (e.g., cupric chloride).

Among the many suitable acidic substances which may be employed in controlling or adjusting the pH of the sensitizing solution are fluoroboric acid, citric acid, lactic acid, phosphoric acid, sulfuric acid, acetic acid, formic acid, boric acid, hydrochloric acid, nitric acid and the like. A wide variety of bromide, chloride and iodide salt and other halide-generating water soluble compounds may be utilized to provide part or all of the desired halide ion content of the treating solution. These may include, inter alia, salts of metals in general and these halogens as exemplified by cupric bromide, nickel chloride, cobalt chloride, cupric chloride, sodium iodide, potassium iodide, lithium chloride, magnesium iodide, magnesium bromide, sodium bromide, potassium bromide, and the like. Bromide salts are preferred, as they produce a higher degree of sensitivity (i.e., darker and denser deposits) on the substrate than the corresponding chloride in at least certain instances.

The halide ions constitute only a minor proportion of the solute and may typically range from about 0.045 to 1.6%, preferably about 0.13 to 0.45%, based on the total weight of dissolved solids. The amount of halogen may be stated otherwise as between about 0.9 and 25 milliequivalents of halogen per liter of the sensitizing solution, preferably about 2.5 to 9 milliequivalents, e.g., 0.3–1.0 gm/l for cupric bromide. Increasing the proportions of the halide ions is usually undesirable as such increases appear to gradually diminish the sensitizing effect of the treatment below what is obtainable with the optimum amount. Also, the proportion of these halide ions expressed as equivalents is less than that of the cupric or other reducible non-noble metal cations in the treating solution. For instance, the ratio of equivalents of such metal ions to halide ions is usually in the range of at least 2:1, and preferably about 4:1 to 100:1.

The radiation sensitive composition is applied to the material to thoroughly wet the material defining the pores whereby the porous member is subjected to the radiation sensitive composition for a time sufficient for the composition to permeate or penetrate through the pores of the material and form a coating on the pore interior along the material defining the pores from one side of the porous planar material to the other. Thereafter, the coating porous member is dried by air drying or oven baking at below 50° C. At this stage, to preserve the light-sensitive nature of the treating compositions, the material should be processed under yellow light conditions. The member should also be kept at a temperature less than 70° F. and at no greater than 60% relative humidity because of possible absorption of water by the material of the member which can adversely affect the process.

The surface of one side of the coated porous member is masked with an opaque cover 13 (FIG. 2) in selected areas so that subsequent radiation will not strike the covered area. The masking can result in dot shaped conductive areas of any desired, shape, size, array or alternating bands or strips of conductive areas through the z-axis direction, separated by alternating bands of nonconductive areas (electrically isolating), for use as an electrical connector. The dots are conventionally circular but could have other geometrical configurations, as squares, rectangles, etc. The size of the dot can be as small as a 0.0001 inches and as large as 0.025 inches, preferably 0.001 inches, 0.002 inches, 0.003 inches, 0.004 inches, 0.005 inches, 0.008 inches, 0.009 inches or fraction thereof where the pitch, defined as the distance between the centers of adjacent dots is preferably at least twice the dimension of the dots, e.g., 1 mil dot, 2 mil pitch.

The masked material 10 is exposed to radiation, such as light, electron beams, x-ray, and the like, preferably ultraviolet radiation, for a time and at a power sufficient to reduce the metallic cations in the metal salt to metal nuclei throughout the thickness of the material. The material 10 is then unmasked and washed with an acidic or alkaline washing solution to wash off the radiation sensitive composition that had been protected by the opaque cover. The acidic or alkaline washing (or fixing) solution does not affect the areas where the radiation had reduced the metal cations to metal nuclei, if the solution is not left in contact with the areas for more than a few minutes, e.g., 5 minutes or less.

Figure 2:
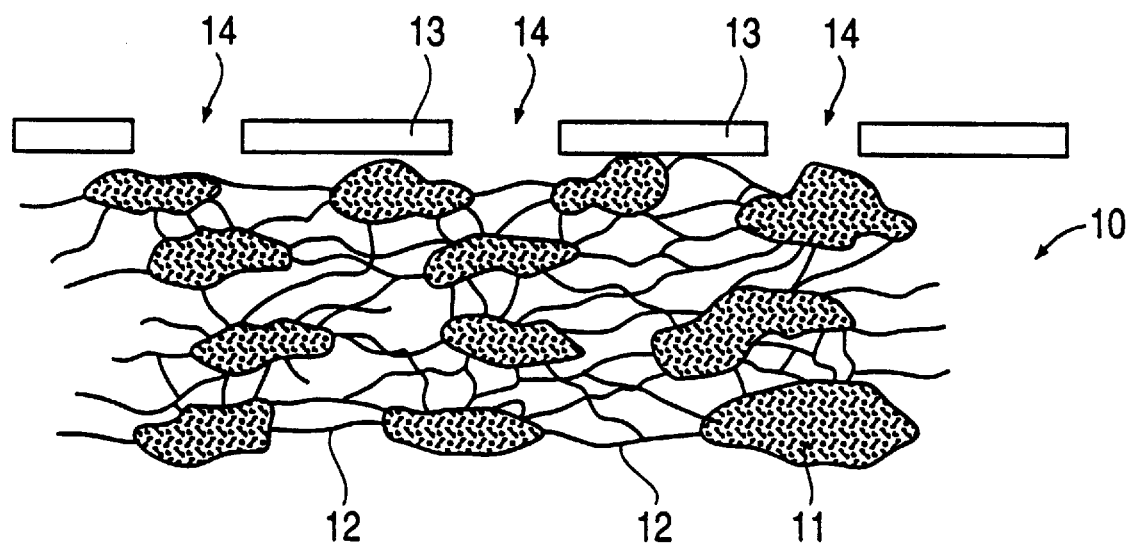
FIG. 2 is a view of a planar, open cell, porous member having opaque masking.
Figure 3:
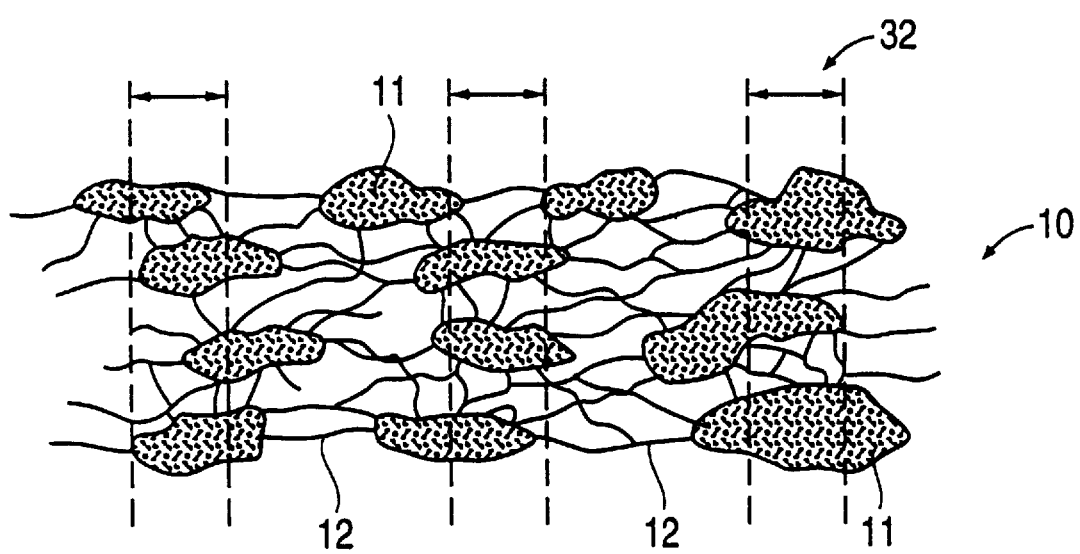
FIG. 3 is a view of an open cell, planar porous member showing designated areas for UV light exposure.

Specifically, the treated material 10 is selectively masked with a metallic mask, diazo or silver halide film, as shown in FIG. 2. The masked material 10 is then photo imaged with either a non-collimated or collimated ultraviolet light source of less than 500 manometers wavelength. The catalyst, the nonconductive metal nuclei, itself requires a minimum of 200 millijoules radiant energy to establish a stable photo image.

The UV light energy is strong enough to penetrate through the thickness of the porous material. Thus, in subsequent plating operations, the conductive metal plates continuously through the z-axis and provides electrical continuity in the z-axis. If desired, the UV light energy can be applied to both sides of the planar member.

After a five minute normalization period, the catalyzed material is then washed for a short period of 30–90 seconds in a sulfuric acid solution, e.g. a solution consisting of 8% sulfuric acid by weight and 92% deionized water by weight or an alkaline solution consisting of 40 g/l of ethylene diamine tetraacetic acid, 100 ml/l of formaldehyde, adjusted at a pH of greater than 10 with sodium hydroxide. The purpose of this washing step is to eliminate the unexposed catalyst from the material while retaining the photo-reduced image.

The washed material containing the selective image is next stabilized with a reactive metal cation replacement solution. A convenient solution is:

| REACTIVE METAL CATION SOLUTION |
| --- |
| 0.25 gram/liter of palladium chloride |
| 8% sulfuric acid by weight |
| 92% D.I. water by weight |

The image undergoes a replacement reaction of the copper with more stable cation, e.g., palladium. A more stable system is desired because of tendency of the copper to oxidize at such thin layer amounts and because of the ability of the palladium to initiate the reduction reaction in the electroless both more rapidly. The material is kept in this solution at least 30 seconds, and is subsequently washed in D.I. water for about 1 minute.

The catalyzed material is selectively electrolessly plated with one or more conductive metals to a deposition thickness of about 50–60 micro inches. Such metals include copper, nickel, gold, silver, platinum, cobalt, palladium, rhodium, aluminum and chromium. During the time in the electrolyses baths, the material is agitated with a rocking motion to promote diffusion of the metal to the innermost region of the substrate. Plating is carried out by first rinsing in deionized water, then dipping in an agitated electroless copper bath for a time sufficient to deposit copper in the material over the palladium and through the substrate thickness. Thus, within selected areas through the material in the z-axis direction, the material nodes 11 and fibrils 12 are at least partially covered with a conductive metal layer 22, having a z-axis portion 24 and upper and lower contact pads 27 and 28. (See FIG. 4.) Thus the conductive metal 22 forms a continuous path of conductivity 24 through the selected areas between upper and lower pads 27 and 28.

Thereafter, the z-axis material is imbibed with an elastomer 26 which fills the previous designated pores 20. The elastomer can include any material that has elastomeric properties, such as, but not limited to siloxanes (silicone) based elastomers, acrylics, butyl rubbers, chlorosulfonated polyethylene, ethylene-propylene rubber, fluorinated elastomers, and thermoplastic rubbers including polystyrenes, polyethylenes, neoprenes, and polybutadiane. Preferably the elastomer is Dow Corning® 3-1753 which is, as supplied, a translucent liquid having a use range of −55° C. to 200° C., and at 25° C. has a specific gravity of 0.98 and a viscosity of 385 cps at 25° C. The conformal coating of Dow Corning® 3-1753 cures to a silicone elastomer that will not melt or appreciably soften. Other preferred elastomers are Dow Corning® 3-1765, which as supplied, is translucent and at 25° C. has a specific gravity of 0.98 and a viscosity of 230 cps, and Dow Corning® 1-1405 which is translucent, and at 25° C. has a specific gravity of 0.98 and a viscosity of 450 cps.

An imbibing solution is prepared from non-adhesive silicone elastomers, such as, Dow Corning® 3-1753, 1-1405 and PSA 595 silicone from General Electric, in an appropriate solvent, such as octamethyltrisiloxane (05-20), methyl dimethylformate (DMF), tetrahydrofuran (THF), mineral spirits, lower alcohols such as $C_1$–$C_6$ alcohols, preferably isopropanol, and ketones solvent from Dow Corning, where the elastomer comprises 10% to 70% by weight of the solution. The elastomer is thoroughly mixed and dissolved in the solvent to form an elastomer solution, by stirring or similar mixing techniques. The elastomer solution is placed in a tank or other suitable vessel and the selectively conductive z-axis material is then immersed in the elastomer solution to imbibe or impregnate the solution into the pores of the material. Immersion can be by dipping. Although dipping is the preferred impregnating technique, any other process capable of impregnating the z-axis material with the elastomer solution, such a pressurized spraying can also be used.

The z-axis material containing the elastomer solution is placed in a drying rack to air dry for 2 to 15 minutes, preferably 5 to 10 minutes, most preferably 5 minutes. The drying time is controlled by the pore size, material thickness and quantity of solvent. Longer or shorter periods of air drying may be necessary if thicker z-axis materials are to be air dried or higher solvent quantities are present. Thereafter, the rack containing the air dried z-axis impregnated material is placed in a heated oven, maintained at a temperature of between about 95° C. and 145° C., preferably about 120° C., for a period of time between 10 and 70 minutes, preferably 30 minutes to remove the solvent. The drying and heating is carried out until the residual solvent content is reduced to less than about 1.0% by weight, preferably 0.2% by weight.

Figure 5:
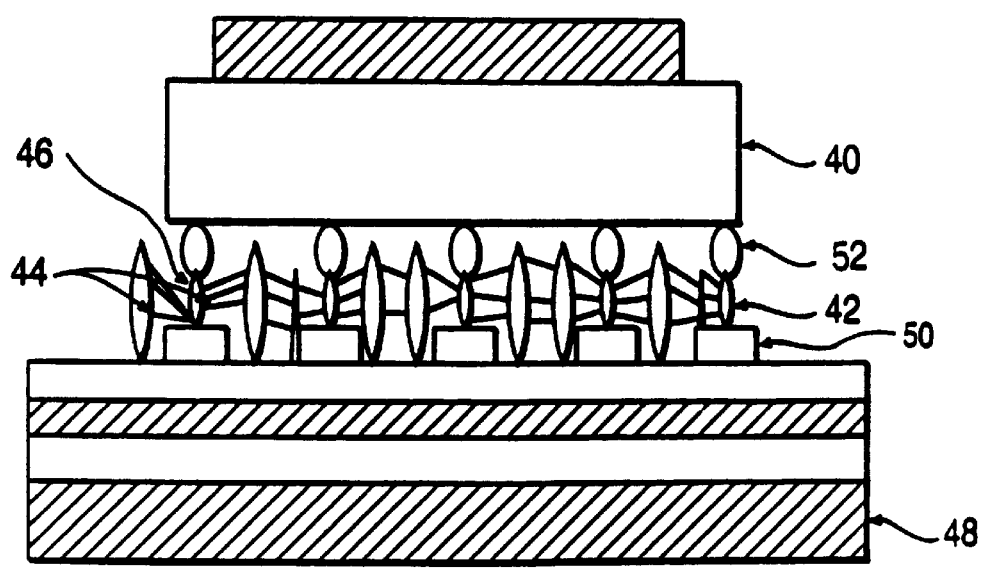
FIG. 5 is schematic of a BGA chip electrically connected to the contact pads of a substrate via a reusable, elastomer containing z-axis material according to the present invention.

Referring to FIG. 5, the non-adhesive selectively conductive z-axis material 42 containing conductive paths 44 and silicone elastomer 46 is placed between a chip 40 and a substrate 48 with pads 50. The chip 40 contains ball grids 52. Under low pressure, 10–25 psi, the chip and substrate become electrically connected so that the ball grid members 52 contact z-axis conductive paths 44 which are connected to the pads 50 at less than 50 psi. Due to the flexible nature of the z-axis material, which can be compressed to between 25 and 75% of its uncompressed dimension, the ball grids are electrically connected to the substrate pads and the areas between adjacent pads 50 and adjacent ball grids 52 are filled with the material 42. Because the conductive paths 24 are retained in position by the infrastructure of the porous material, and not solely supported by the elastomer, as occurs with conductive particles, shorting does not occur. When the test procedure is finished, the chip is separated and the elastomeric z-axis material removed. Because the elastomer is non-adhesive, it does not permanently stick to the chip, or electrical contacts. These components can be readily cleaned and used for the appropriate applications. Similarly, the elastomer containing material is reused to evaluate another chip or electrical component.

SELECTIVELY CONDUCTIVE Z-AXIS MATERIAL EXAMPLES

In the following examples, the catalytic treating solution used was prepared by adding to one liter of D.I. water:

| COMPONENT | AMOUNT (gms) | |
|---|---|---|
| 2,6 di-sodium anthraquinone di-sulfonic salt | 30 | |
| 2,7 di-sodium anthraquinone di-sulfonic salt | | 30 |
| sorbitol | 220 | 220 |
| cupric acetate | 15 | 15 |
| cupric bromide | 0.5 | 0.5 |
| olin G-10 surfactant | 2 | 2 |
| fluoroboric acid | pH 3.5–3.8 | |

The fixing solution used was 8% sulfuric acid by weight, 92% distilled water by weight. A stabilizing solution is laso used, an contains the following components.

| STABILIZING SOLUTION |
|---|
| 0.25 g/l palladium chloride |
| 8% sulfuric acid by weight |
| 92% distilled water by weight |

EXAMPLE 1

As taught in the '467 patent, a stretched porous polytetrafluoroethylene membrane obtained from W.L. Gore & Associates was treated with a wetting agent by immersing it in a solution of 75% methanol, 25% ethanol and of 1 weight % copolymer of tetrafluoroethylene and vinyl alcohol at room temperature for about 30 seconds.

The wetted membrane was then dipped into the catalytic treating solution for 60 seconds and was then dried in an oven at 50° C. for 3 minutes. One surface of the membrane was then masked with dots of a diazo film of 6 mil diameters and 12 mil pitch (center to center).

The membrane was then exposed to a collimated UV light source at 1600 millijoule for about 2 minutes. After a 5 minute normalization period, the UV treated membrane was then washed for 30 seconds in the fixing solution to eliminate unexposed catalytic treating solution. The selectively imaged membrane was then stabilized by dipping into the stabilizing solution for one minute and then washing in distilled water for one minute.

The stabilized membrane was then dipped into a copper plating bath composition (Shipleys 3) on a per liter of D.I. water basis,

| PLATING SOLUTION |
|---|
| 30 grams of ethylenediamine tetra acetic acid |
| 6 to 8 grams sodium hydroxide |
| 5 to 7 grams copper II sulfate |
| 2 to 3 grams formaldehyde |
| 2 grams of a given surfactant |

The membrane was agitated in the bath using an agitation bar for 7½ minutes to promote diffusion of copper throughout the pores of the membrane in the catalyzed portion throughout in the z-axis.

EXAMPLE 2

A 6 mil (150 micrometer) thick, stretched, porous polytetrafluoroethylene membrane was wetted by subjecting it to 2 propanol by dipping for 1 minute. It was then dipped into the catalytic treating solution for one minute and then dried as in Example 1. It was then masked as in Example 1 and subjected to UV light as in Example 1. It was then subjected to the fixing and to the stabilizing solution as in Example 1. It was then plated with copper as in Example 1 and coated with copper as in Example 1.

EXAMPLE 3

A 2 mil thick stretched porous polytetrafluoroethylene membrane was prepared as in Example 1 except that the masking strips were 3 mil pad with a 10 mil pitch.

EXAMPLES 4–6

The procedure of Example 1 was followed for membranes formed from porous polyethylene, porous polypropylene and open cell, porous polyurethanes to produce a z-axis material having irregularly shaped conductive pathways that extend along the z-axis.

ELASTOMERIC SELECTIVELY CONDUCTIVE Z-AXIS MATERIAL

EXAMPLE 7

The z-axis material of Example 1 was imbibed with the following solution:

| ELASTOMER SOLUTION |
|---|
| 22 gms of Silicone 3-1765 (Dow Corning) |
| 78 gms OS-20 solvent (Dow Corning) | by placing the solution in a tank and dipping the z-axis material, which is supported on a frame, into the solution. The impregnated z-axis material was air dried for 5 minutes in a drying rack. The drying rack was placed in an oven that was heated to 120° C. for 30 minutes to remove solvent.

EXAMPLE 8

Figure 11:
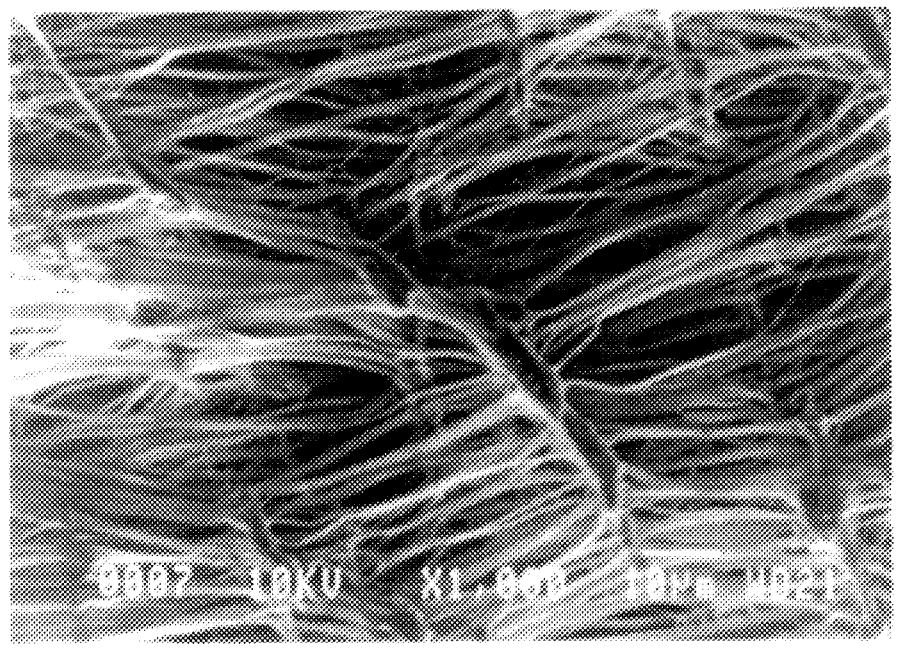
FIGS. 11–14 are scanning electron micrographs (SEM) of the polytetrafluoroethylene membrane used to prepare the z-axis materials of Examples 9–12, respectively.

A membrane formed from a stretched porous polytetrafluoroethylene membrane having the node-fibril structure shown in FIG. 11 (1000× magnification) is 76 μm thick with a density of 0.22 gm/cm³ and an void volume of 88% at 25° C., and is available from W.L. Gore & Associates, Inc., was prepared as in Example 1 to form a z-axis membrane, except that the masking strips were 2 mil pad with a 5 mil pitch. The z-axis membrane was impregnated with a silicone solution containing 20% Dow Corning® 3-1753 silicone.

EXAMPLE 9

A polytetrafluoroethylene membrane similar to that of Example 8 having the node-fibril structure in FIG. 11 (1000× magnification), was prepared as in Example 1 to form a z-axis membrane, except that the masking strips were 8 mils with a 15 mil pitch. The z-axis membrane was impregnated with a silicone solution containing 30% Dow Corning® 3-1753 silicone.

EXAMPLE 10

Figure 12:
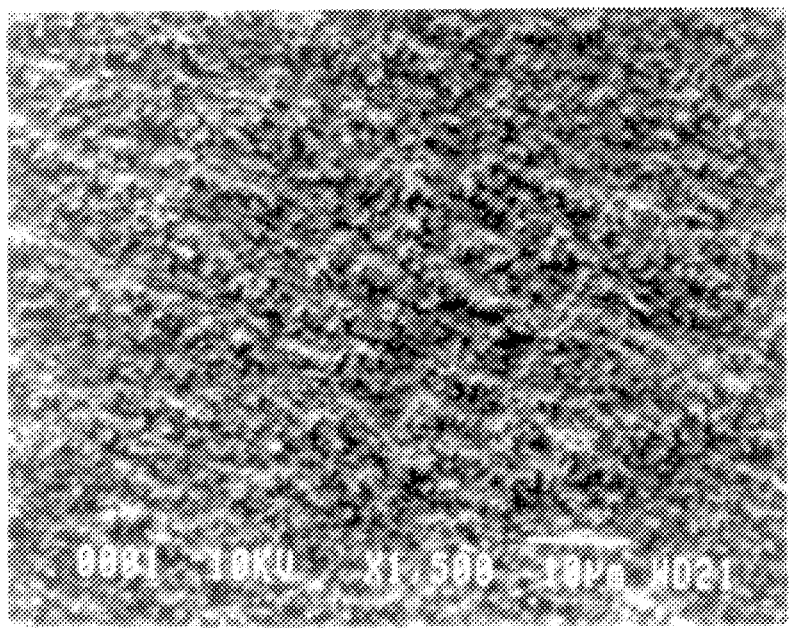

A stretched porous polytetrafluoroethylene membrane with the node-fibril structure shown in FIG. 12 (1500× magnification) that is 40 μm thick, with a density 0.4 gm/cm³ and an void volume of 80% at 25° C., available from W. L. Gore & Associates, Inc., was prepared as in Example 1 to form a z-axis membrane, except that the masking strips were 8 mils with a 15 mil pitch. The z-axis membrane was impregnated with a silicone solution containing 30% Dow Corning® 3-1753 silicone.

EXAMPLE 11

Figure 13:
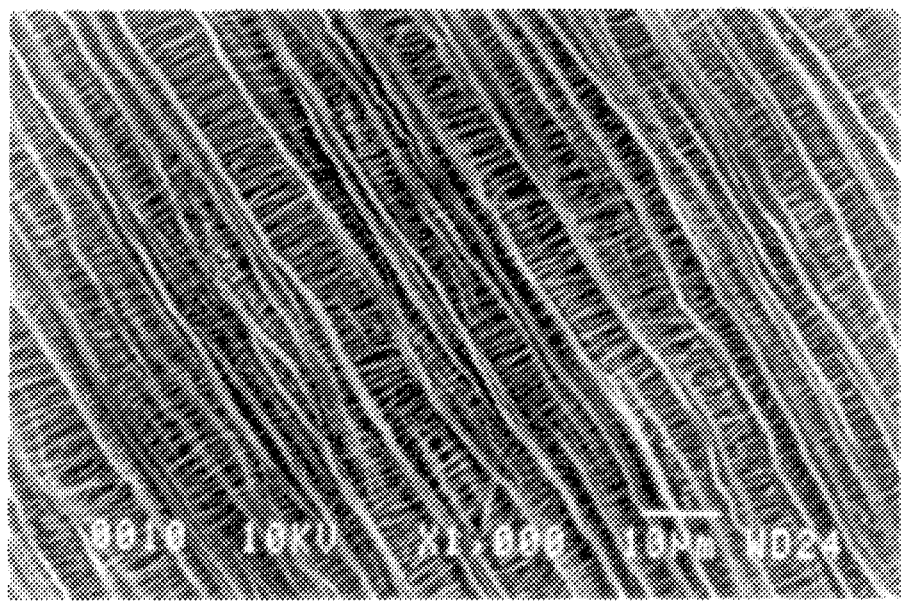

A stretched porous polytetrafluoroethylene membrane with the node-fibril structure of FIG. 13 (1000× magnification) that is 100 μm thick, with a density of 0.35 gm/cm³ and an void volume of 82% at 25° C., available from W. L. Gore & Associates, Inc., was prepared as in Example 1 to form a z-axis membrane, except that the masking strips were 8 mils with a pitch of 15 mils. The z-axis membrane was impregnated with a silicone solution containing 30% Dow Corning® 3-1753 silicone.

EXAMPLE 12

Figure 14:
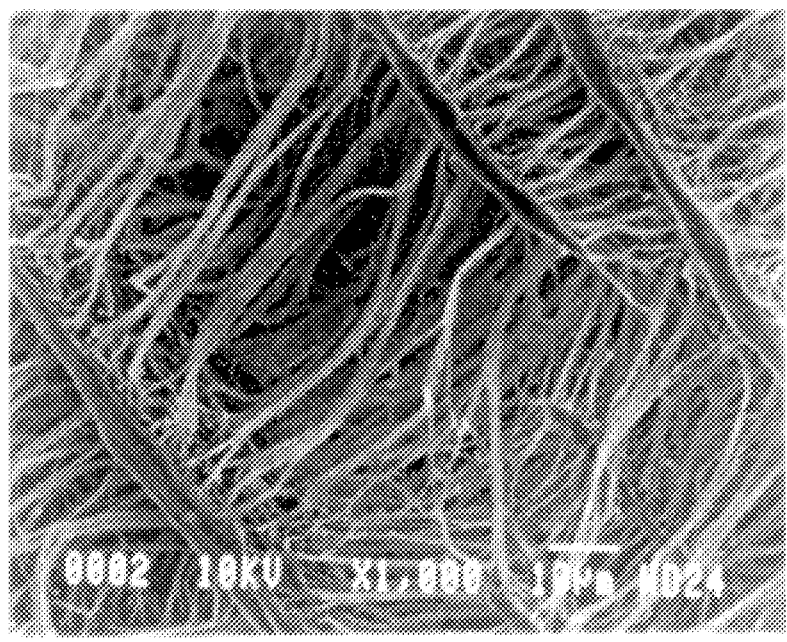

A stretched porous polytetrafluoroethylene membrane with the node-fibril structure of FIG. 14 (1000× magnification) is 150 μm thick, with a density of 0.20 gm/cm³ and an void volume of 90% at 25° C., and which is available from W. L. Gore & Associates, Inc., was prepared as in Example 1 to form a z-axis membrane, except that the masking strips were 8 mils with a 15 mil pitch. The z-axis membrane was impregnated with a silicone solution containing 30% Dow Corning® 3-1765 silicone.

EXAMPLE 13

The z-axis substrate prepared in Example 10 is impregnated with a 30% silicone solution of Dow Corning silicone 3-1756 and processed as described above to remove solvent. The resulting selectively conductive z-axis material was evaluated using an Instron testing device having an Interface Type 5500, a crosshead speed of 1.0 in/min., a sample rate of 18.2000 pts/secs., (at 73° F., 50% humidity), and a grip distance of 0.005 inches and grip length of 0.005 in. The physical properties of z-axis material with and without silicone are set forth below.

| PROPERTY | SILICONIZED | | UNSILICONIZED | |
|---|---|---|---|---|
|  | MEAN | S.D.[1] | MEAN | S.D. |
| Displacement at Max Load (in) | 0.637 | 0.090 | 1.218 | 0.057 |
| Load at Max Load (lbf) | 3.150 | 0.81 | 3.149 | 0.112 |
| Stress at Max Load (psi) | 1852.664 | 47.378 | 1852.342 | 66.005 |
| Strain at Max Load (in/in) | 29.665 | 13.268 | 114.316 | 63.838 |
| Maximum Displacement (in) | 0.788 | 0.203 | 1.394 | 0.315 |
| Maximum Strain (in/in) | 35.185 | 14.336 | 123.131 | 54.720 |
| Modulus (AutYoung) (psi) | 213.092 | 144.109 | 83.787 | 20.695 |
| Slope(AutYoung) (lbf/in) | 13.600 | 1.450 | 12.043 | 4.122 |

[1] S.D. is the standard deviation

Figure 6:
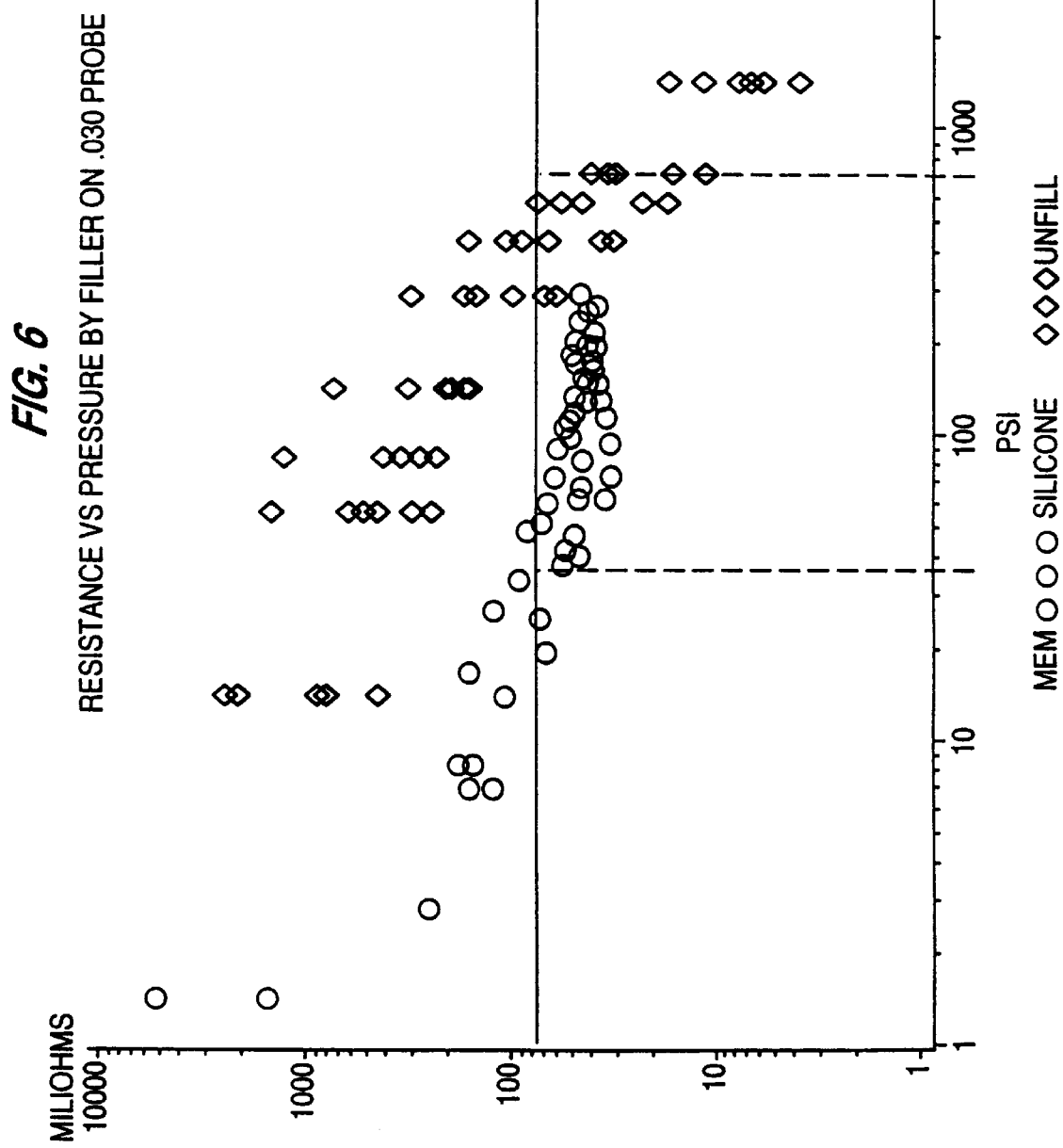
FIGS. 6–8 graphically compare various electrical and physical properties of a z-axis material with and without a silicone elastomer.
Figure 7:
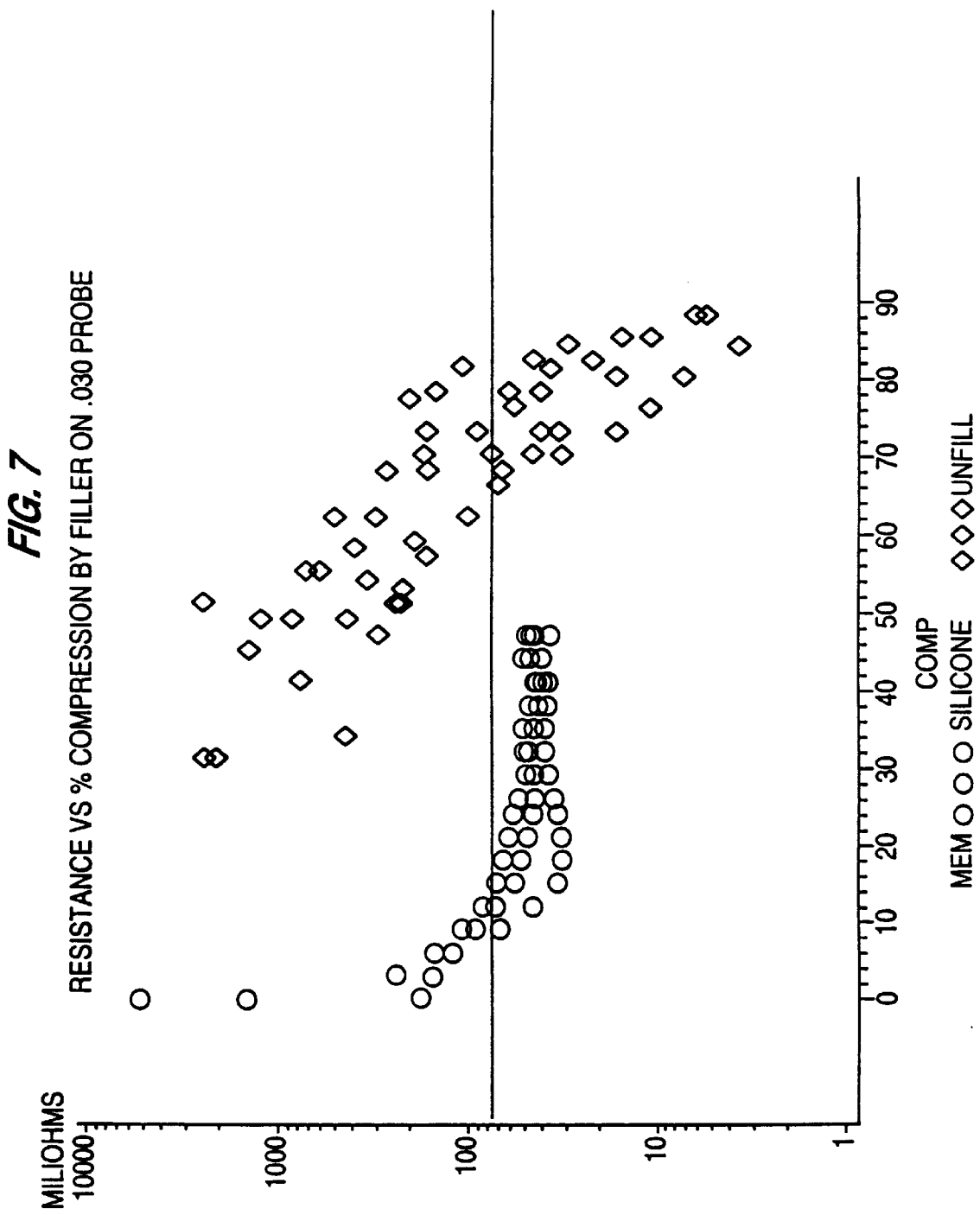
Figure 8:
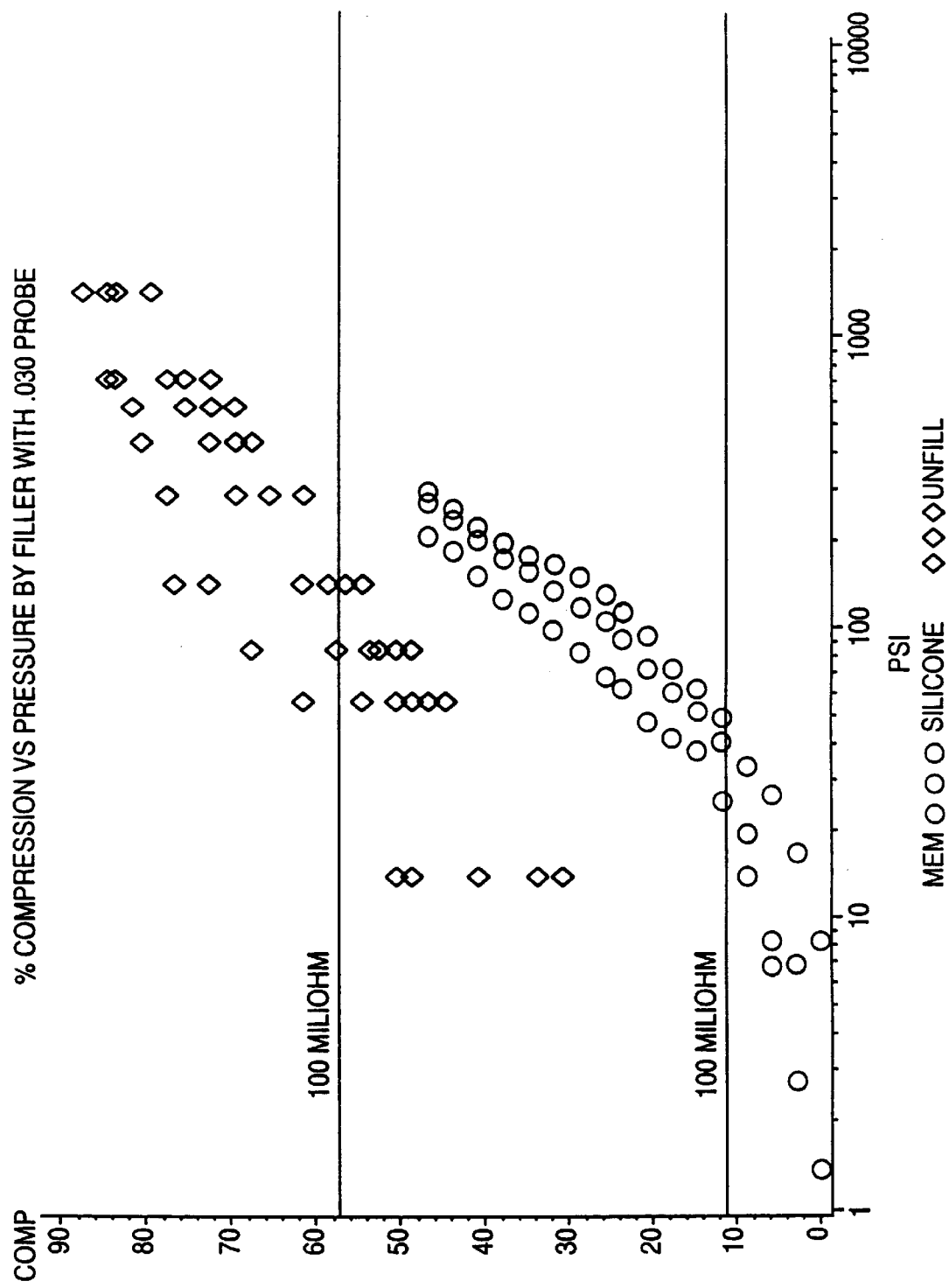

The electrical properties of a z-axis material with silicone and without silicone are shown in FIGS. 6–8. The data is obtained with a load cell (not shown) that includes probes of different diameters and is operated at ambient temperatures. The material to be tested is located on a ground plate below the probe. The z-axis material with or without silicone elastomer is placed in the cell. A load is put on the inserted material, the material compressed by a 30 mil probe, and a 10 milli amp current is applied. An ohm meter is associated with the load tester and indicates the resistance as the load is increased. The device also includes a load gauge and gap indicator.

FIG. 6 compares the relationship of resistance and pressure and shows that the level of desired contact resistance can be obtained at a lower pressure than the non-filled (unsiliconized) sample.

FIG. 7 shows the relationship of resistance and compression of the z-axis material with and without silicone and demonstrates that at relatively low material compression the desired resistance is achieved with the siliconized membrane relative to the unfilled material.

FIG. 8 depicts the relationship between compression and pressure and shows that only low pressure is needed at the desired resistance.

Figure 9:
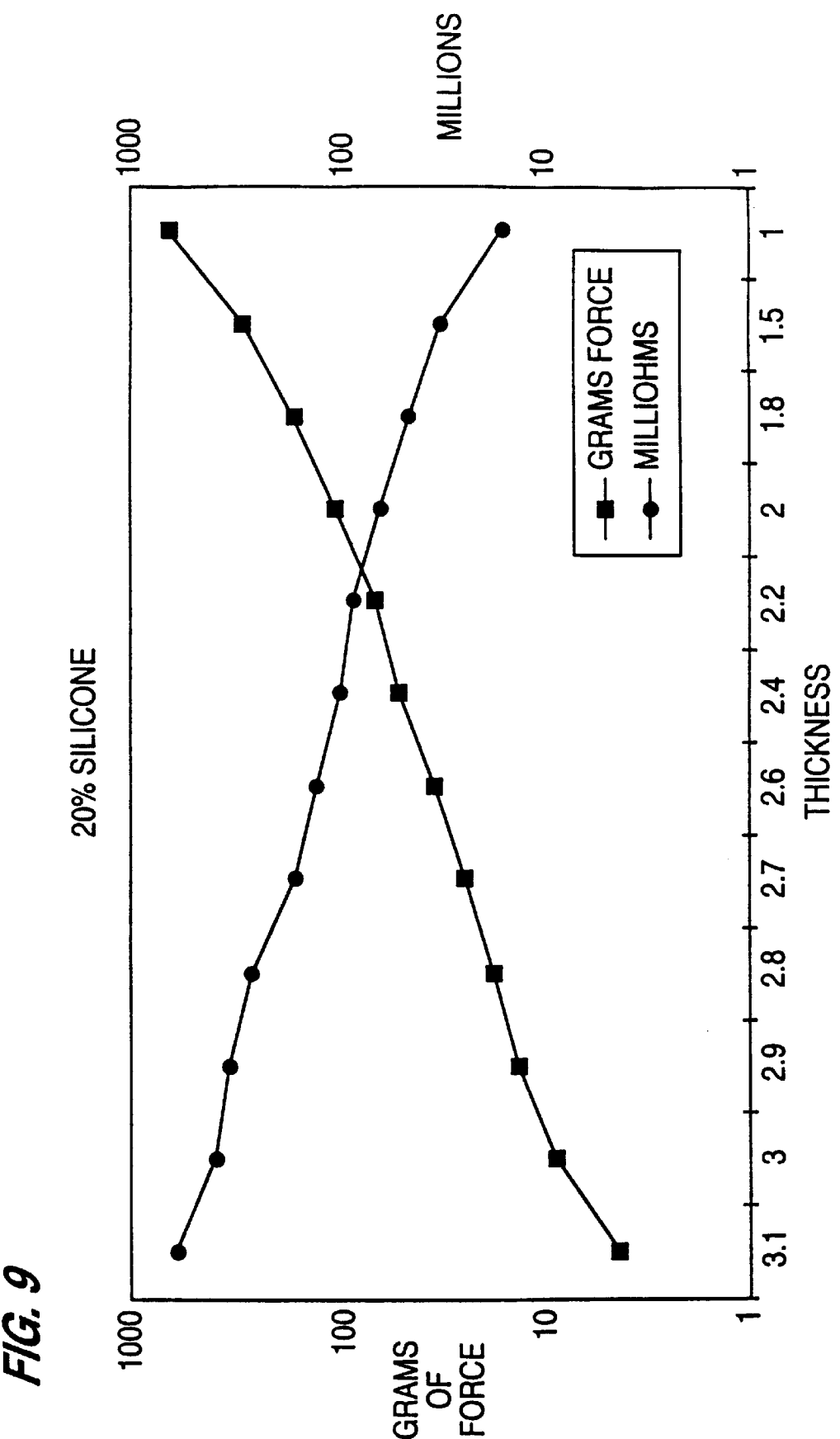
FIG. 9 shows the properties of a z-axis material containing 20% of a silicone elastomer.

The electrical properties of z-axis material containing 20% Dow Corning® Silicone 3-1753 are shown in FIG. 9.

Figure 10:
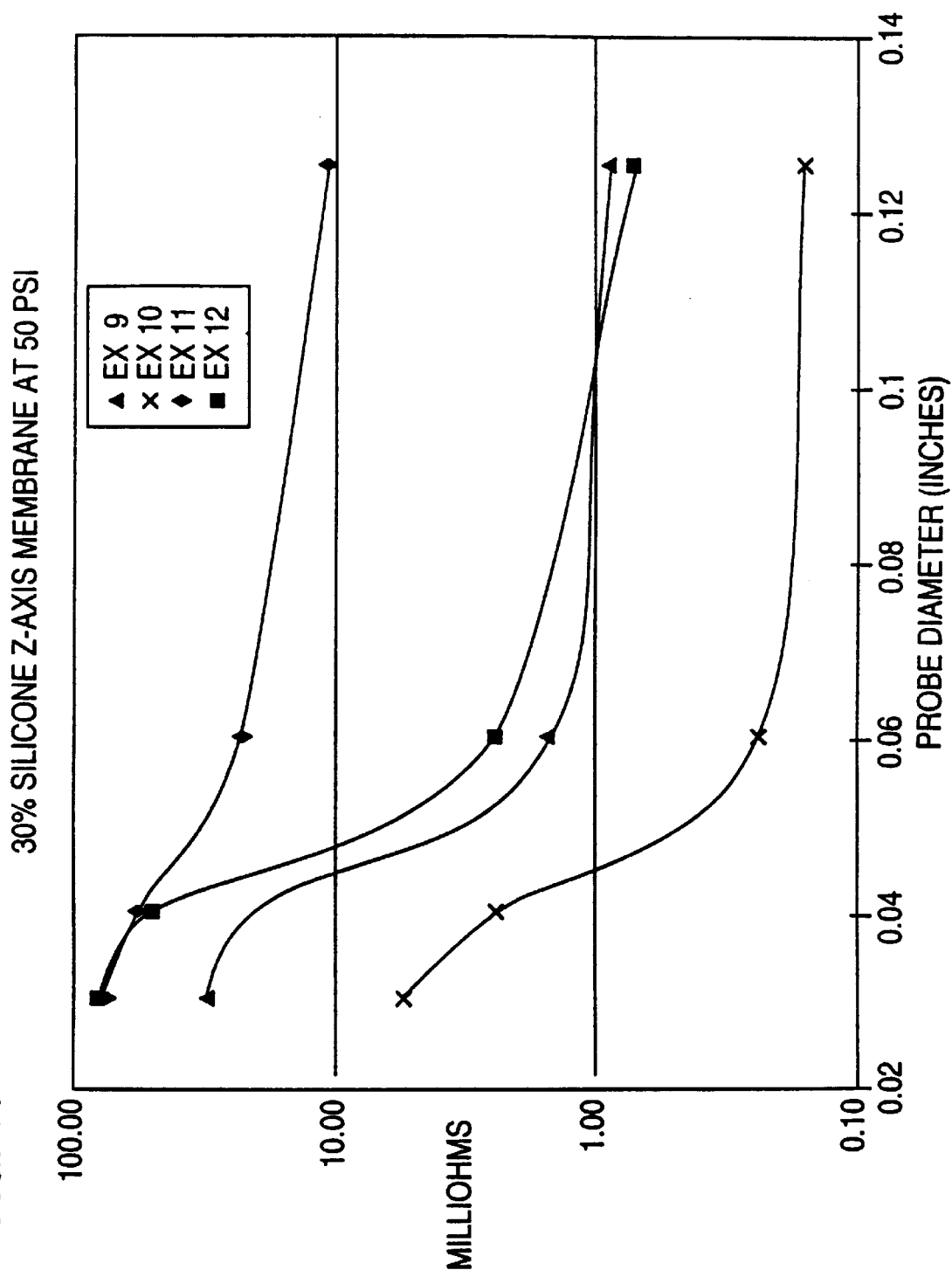
FIG. 10 shows the properties of z-axis materials containing 30% of a silicone elastomer.

The electrical properties of the siliconized membranes of Examples 9–12 are shown in FIG. 10. These results demonstrate the effect of probe size and material character.

Although the invention has been described in conjunction with the specific embodiments, it is evident that many alternatives and variations will be apparent to those skilled in the art in light of the foregoing description. Accordingly, the invention is intended to embrace all of the alternatives and variations that fall within the spirit and scope of the appended claims.

We claim:

1. An electronic testing package comprising at least first and second electronic components, said package further including a reusable, selectively conductive member comprising a planar, open cell, porous material having a x, y and z-axis with a series of electrically isolated, vertically defined cross-section areas that extend from one side of said material to another side of said material, in the z-axis direction, and being covered with conductive metal, and containing non-tacky elastomer in areas between adjacent vertically conductive areas, said selectively conductive material providing, in the z-axis direction, electrical contact between said first and second electrical components and being readily removable therefrom.

2. The package according to claim 1, wherein said planar, open cell, porous material is a polymer.

3. The package according to claim 2, wherein said polymer is a polyolefin.

4. The package according to claim 3, wherein said polyolefin is porous polypropylene or porous polyethylene.

5. The package according to claim 2, wherein said polymer is a fluoropolymer.

6. The package according to claim 2, wherein said polymer is a fluoropolymer.

7. The package according to claim 6, wherein said fluoropolymer is porous polytetrafluoroethylene (PTFE).

8. The package according to claim 6, wherein said fluoropolymer is, porous expanded polytetrafluoroethylene.

9. The package according to claim 6, wherein said fluoropolymer is a porous copolymer of polytetrafluoroethylene.

10. The package according to claim 9, wherein said copolymer includes polyesters.

11. The package according to claim 9, wherein said copolymer includes polystyrenes.

12. The package according to claim 6, wherein said fluoropolymer is a porous copolymer of fluorinated ethylene-propylene (FEP).

13. The package according to claim 6, wherein said fluoropolymer is a porous copolymer of perfluoroalkoxy tetrafluoroethylene (PFA) with a $C_1$–$C_4$ alkoxy group.

14. The package according to claim 2, wherein said elastomer is a silicone.

15. The package according to claim 14, wherein a polybutadiene compound is combined with the silicone.

16. The package according to claim 14, wherein the silicone is a nonadhesive, non-tacky silicone.

17. The package according to claim 2, wherein said conductive metal is copper.

18. The package according to claim 2, wherein said conductive metal is nickel.

19. The package according to claim 2, wherein said conductive metal is silver or gold.

20. The package according to claim 2, wherein said conductive metal is platinum, palladium or rhodium.

21. The package according to claim 2, wherein said conductive metal is cobalt.

22. The package according to claim 2, wherein said conductive metal is aluminum or chromium.

23. The package according to claim 1, further including a polybutadiene compound.

24. The package according to claim 1, wherein said planar, open cell, porous material prior to being covered with a conductive layer has a void volume of 20 to 90%.

25. The package according to claim 24, wherein said void volume is 80%.

26. The package according to claim 24, wherein said void volume is 88%.

27. The package according to claim 1, wherein said elastomer is a 20 wt % silicone solution.

28. The package according to claim 1, wherein said elastomer is a 30 wt % silicone solution.

29. The package according to claim 1, wherein said planar, open cell porous member is 5 to 500 microns thick.

30. The package according to claim 29, wherein said planar, open cell porous member is 10 to 125 microns thick.

31. The package according to claim 29, wherein said planar, open cell porous member is about 75 microns thick.

32. The package according to claim 29, wherein said planar, open cell porous member is about 150 microns thick.

33. The package according to claim 29, wherein said planar, open cell porous member is about 10 microns thick.

34. The package according to claim 1, wherein said conductive metal is copper.

35. The package according to claim 1, wherein said conductive metal is nickel.

36. The package according to claim 1, wherein said conductive metal is silver or gold.

37. The package according to claim 1, wherein said conductive metal is platinum, palladium or rhodium.

38. The package according to claim 1, wherein said conductive metal is cobalt.

39. The package according to claim 1, wherein said conductive metal is aluminum or chromium.

* * * * *